(12) United States Patent
Sunahara et al.

(10) Patent No.: US 10,003,006 B2
(45) Date of Patent: Jun. 19, 2018

(54) PIEZOELECTRIC ACTUATOR, METHOD FOR MANUFACTURING THE SAME, AND MAGNETIC DISC APPARATUS

(71) Applicant: Murata Manufacturing Co., Ltd., Nagaokakyo-shi, Kyoto-fu (JP)

(72) Inventors: Hirofumi Sunahara, Nagaokakyo (JP); Takahiro Matsumoto, Nagaokakyo (JP); Masachika Takata, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 531 days.

(21) Appl. No.: 14/669,933

(22) Filed: Mar. 26, 2015

(65) Prior Publication Data
US 2015/0263262 A1    Sep. 17, 2015

Related U.S. Application Data

(63) Continuation of application No. PCT/JP2013/075424, filed on Sep. 20, 2013.

(30) Foreign Application Priority Data

Sep. 27, 2012   (JP) ................. 2012-215182

(51) Int. Cl.
*H01L 41/053*   (2006.01)
*G11B 5/48*   (2006.01)
(Continued)

(52) U.S. Cl.
CPC ........ *H01L 41/0533* (2013.01); *G11B 5/4873* (2013.01); *H01L 41/23* (2013.01); *H01L 41/331* (2013.01); *H01L 41/338* (2013.01)

(58) Field of Classification Search
CPC ... H01L 41/0533; H01L 41/23; H01L 41/331; H01L 41/083; H01L 41/0838; H01L 41/0913; G11B 5/4873
(Continued)

(56) References Cited

U.S. PATENT DOCUMENTS 7,294,953 B2 * 11/2007 Iwase ................. H01L 41/0472
310/366
2002/0014815 A1    2/2002 Kurano et al.
(Continued)

FOREIGN PATENT DOCUMENTS

CN    101983438 A    3/2011
JP    2000-298962 A    10/2000
(Continued)

OTHER PUBLICATIONS

International Search Report issued for PCT/JP2013/075424, dated Oct. 29, 2013.
(Continued)

*Primary Examiner* — Bryan Gordon
(74) *Attorney, Agent, or Firm* — Arent Fox LLP

(57) ABSTRACT

A piezoelectric actuator that includes (a) a piezoelectric body made of piezoelectric ceramic, the piezoelectric body having two principal surfaces facing each other and having four side surfaces, (b) external electrodes on the principal surfaces, (c) recessed portions in the four side surfaces, and (d) a coating layer made of resin and provided on the four side surfaces. The coating layer covers the recessed portions in the four side surfaces.

9 Claims, 17 Drawing Sheets

(51) Int. Cl.
*H01L 41/23* (2013.01)
*H01L 41/331* (2013.01)
*H01L 41/338* (2013.01)

(58) Field of Classification Search
USPC ................................. 310/340, 328, 364, 368
See application file for complete search history.

(56) References Cited

U.S. PATENT DOCUMENTS

| | | | |
|---|---|---|---|
| 2002/0030943 A1 | 3/2002 | Kikkawa et al. | |
| 2003/0107301 A1* | 6/2003 | Asano | H01L 41/083 310/328 |
| 2004/0004414 A1 | 1/2004 | Kurano et al. | |
| 2004/0070885 A1 | 4/2004 | Kikkawa et al. | |
| 2010/0327699 A1 | 12/2010 | Hassanali et al. | |
| 2012/0176703 A1* | 7/2012 | Nojima | H01L 41/338 360/244.2 |
| 2014/0333183 A1* | 11/2014 | Motani | H01L 41/0533 310/340 |

FOREIGN PATENT DOCUMENTS

| | | |
|---|---|---|
| JP | 2001-118346 A | 4/2001 |
| JP | 2001-339106 A | 12/2001 |
| JP | 2002-025204 A | 1/2002 |
| JP | 2002-141589 A | 5/2002 |
| JP | 2002-150730 A | 5/2002 |
| JP | 2002-183870 A | 6/2002 |
| JP | 2011-514808 A | 5/2011 |
| JP | 2012-155832 A | 8/2012 |

OTHER PUBLICATIONS

Written Opinion of the International Searching Authority for PCT/JP2013/075424, dated Oct. 29, 2013.

* cited by examiner

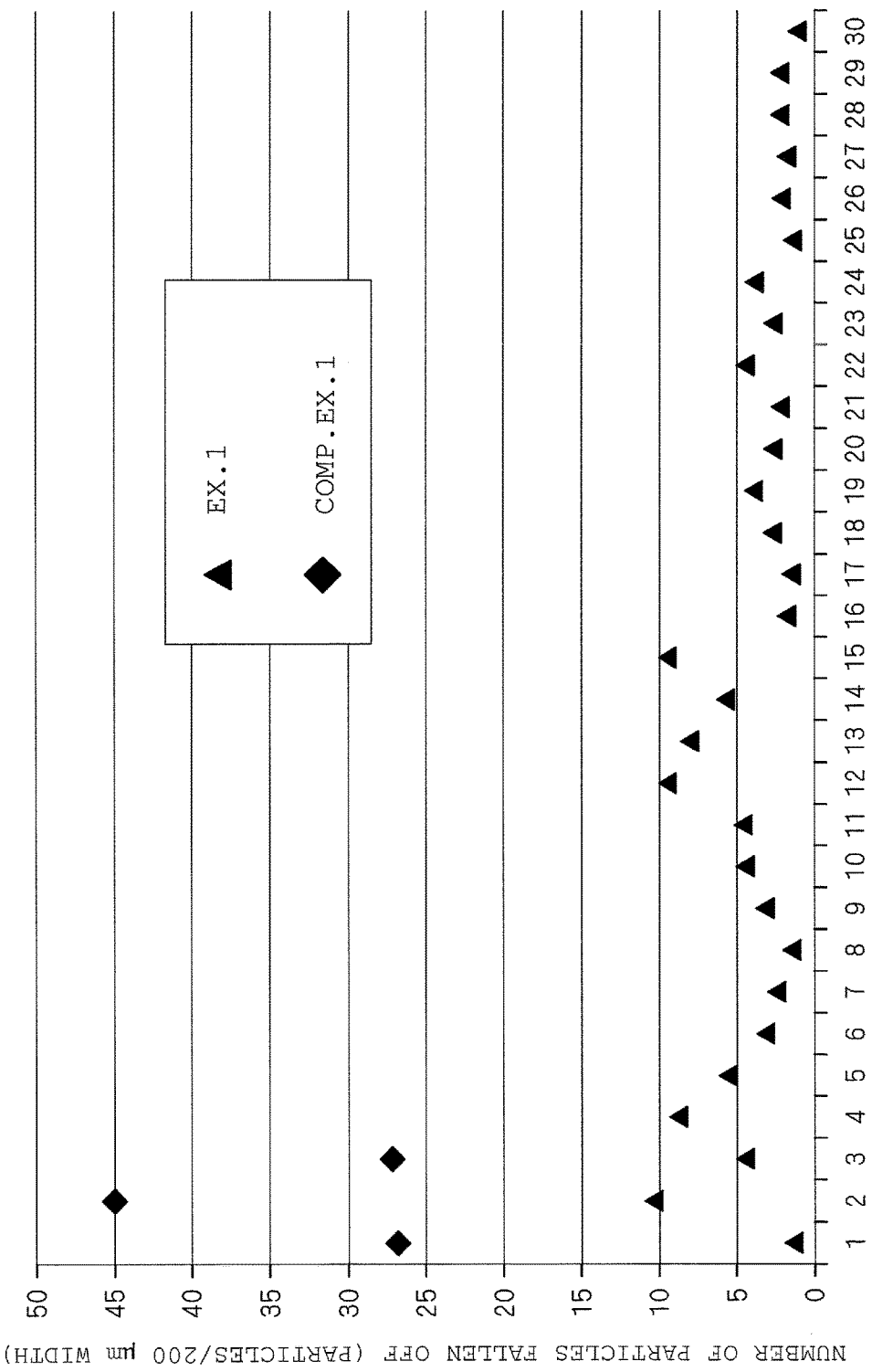

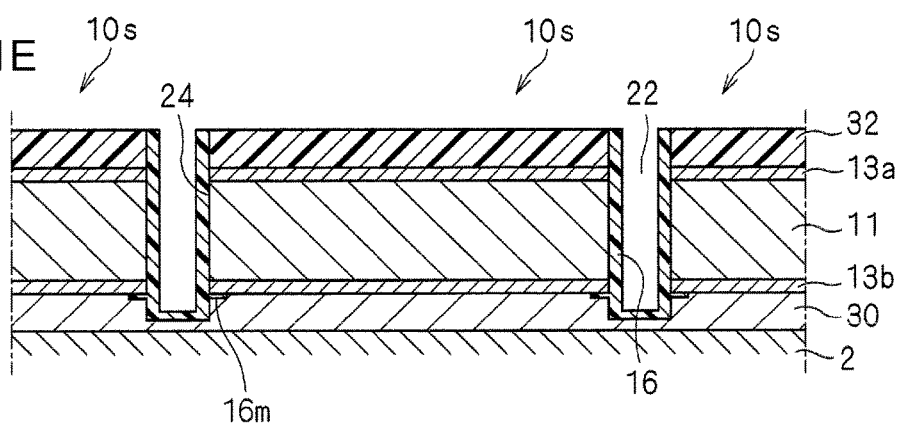
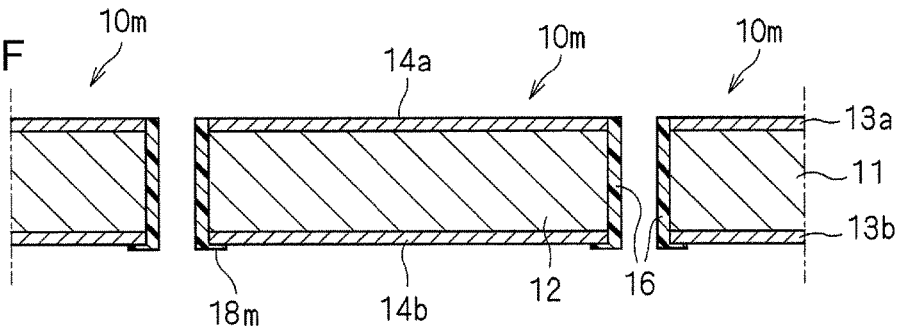

PIEZOELECTRIC ACTUATOR, METHOD FOR MANUFACTURING THE SAME, AND MAGNETIC DISC APPARATUS

CROSS REFERENCE TO RELATED APPLICATIONS

The present application is a continuation of International application No. PCT/JP2013/075424, filed Sep. 20, 2013, which claims priority to Japanese Patent Application No. 2012-215182, filed Sep. 27, 2012, the entire contents of each of which are incorporated herein by reference.

FIELD OF THE INVENTION

The present invention relates to a piezoelectric actuator, a method for manufacturing the piezoelectric actuator, and a magnetic disc apparatus on which the piezoelectric actuator is mounted.

BACKGROUND OF THE INVENTION

Conventionally, on a magnetic disc apparatus, in order to move a magnetic head to an intended position on a disc with a high degree of accuracy, there are mounted a first actuator for largely moving the magnetic head to a vicinity of the intended position and a second actuator for slightly moving the magnetic head to the intended position from the position to which the magnetic head has been moved by the first actuator.

For example, FIG. 19 is a plan view showing a configuration of a conventional magnetic disc apparatus. As shown in FIG. 19, a magnetic head (not shown) is provided on a gimbal 210 connected to an end of a suspension 200, and a voice coil motor 250 as a first actuator is provided on a suspension holding member 230. Between the suspension 200 and the suspension holding member 230, there is provided a piezoelectric actuator 100 as a second actuator.

The piezoelectric actuator 100 is equipped with a cuboid-shaped piezoelectric body made of piezoelectric ceramic such as lead zirconate titanate (PZT) and external electrodes each provided on each of two mutually opposed surfaces of the piezoelectric body, and the piezoelectric body expands and contracts upon application of a voltage to the external electrodes.

In a conventional magnetic disc apparatus, a coating layer 101 made of resin is provided to cover the surfaces of the piezoelectric actuator 100, and the coating layer 101 prevents fine piezoelectric ceramic particles from falling off the piezoelectric body of the piezoelectric actuator 100. Thus, the coating layer prevents the phenomenon that, when the piezoelectric actuator 100 is driven, the fine piezoelectric ceramic particles fall off the piezoelectric body due to expansion and contraction of the piezoelectric body of piezoelectric actuator 100 and other causes, and the fallen-off particles stick to the magnetic head and a magnetic recording disc 310, whereby the reliability of writing of information in the magnetic recording disc 310 and reading-out of information from the magnetic recording disc 310 decreases (for example, see Patent Document 1).

Patent Document 1: Japanese Laid-Open Patent Publication No. 2002-163870

SUMMARY OF THE INVENTION

The coating layer 101 is provided after the piezoelectric actuator 100 is assembled between the suspension 200 and the suspension holding member 230. Thus, the resin used for the coating layer 101 can stick to an unintended place in the magnetic disc apparatus (for example, a vicinity of the magnetic head). In addition, a process for manufacturing the magnetic disc apparatus becomes complex, thereby causing decrease of yield rate or increase of production cost.

Further, Patent Document 1 discloses that a low viscosity resin having an uncured-state viscosity of 1000 mPa·s or lower is preferable as the resin used for the coating layer 101, and the most preferable is a low viscosity epoxy resin adhesive, which is made of epoxy oligomer at a content of less than 20% and epoxy monomer at a content of 80% or more and contains at least polymerization initiator, catalyst, and additive agent which react with at least heat or light.

However, when the uncured-state viscosity of the resin is approximately 100 to 1000 mPa·s, the resin does not get in to the bottoms of fine recessed portions which exist in the surface of the piezoelectric body, and the coating layer 101 is thus likely to fall off. If the coating layer 101 falls off, the surface of the piezoelectric body is exposed, whereby piezoelectric ceramic particles may fall off from the exposed part.

In addition, the higher the uncured-state viscosity of the resin is, the thicker the coating layer 101 covering the surface of the piezoelectric body is. If the coating layer 101 is thick, the coating layer 101 impairs the displacement of the piezoelectric actuator 100, and the displacement characteristic of the piezoelectric actuator 100 is thus deteriorated, whereby the accuracy of moving the magnetic head may decrease.

In view of the above issues, an object of the present invention is to provide a piezoelectric actuator in which piezoelectric ceramic particles are surely prevented from falling off the piezoelectric body, a method for manufacturing the piezoelectric actuator, and a magnetic disc apparatus on which the piezoelectric actuator is mounted.

In order to solve the above objects, the present invention provides a piezoelectric actuator which is configured as described below.

A piezoelectric actuator according to the present invention includes (a) a piezoelectric body which is made of piezoelectric ceramic and has two principal surfaces facing each other and four side surfaces connecting the two principal surfaces, (b) external electrodes provided on the principal surfaces, (c) recessed portions formed in the four side surfaces, and (d) a coating layer made of resin and provided on the four side surfaces. The coating layer covers the recessed portions in the four side surfaces.

In the configuration described above, the six surfaces of the principal surfaces and the side surfaces of the piezoelectric body are covered with the external electrodes and the coating layer. Because the coating layer covers the recessed portions of the piezoelectric body, the coating layer hardly falls off. Because the state is surely kept in which the six surfaces of the piezoelectric body is covered with the external electrodes and the coating layer, piezoelectric ceramic particles are surely prevented from falling off the piezoelectric body.

In a piezoelectric actuator according to the present invention, it is preferable for the piezoelectric actuator to include a reinforcing member made of resin provided, on a surface of at least one of the external electrodes, along a periphery of the surface, the surface being opposite to a surface which is of the at least one of the external electrodes and is in contact with the piezoelectric body.

In this case, because the end part of the external electrode is covered with the reinforcing member and the coating layer, the piezoelectric actuator is strong at the corners thereof.

In a preferred aspect, the reinforcing member is formed integrally with the coating layer.

In a piezoelectric actuator according to the present invention, the coating layer is preferably made of cured resin which has an uncured-state viscosity of greater than 1 mPa·s and less than 100 mPa·s.

If the viscosity of the uncured resin is greater than 1 mPa·s, the coating layer can be provided in contact with the bottoms of the recessed portions of the piezoelectric body. If the viscosity of the uncured resin is less than 100 mPa·s, the thicknesses of the coating layer on the four surfaces of the piezoelectric body cannot be too thick.

In the piezoelectric actuator according to the present invention, it is preferable that the coating layer has thicknesses of 1 µm or less on the four side surfaces of the piezoelectric body.

In this case, the coating layer hardly inhibits the displacement of the piezoelectric actuator, whereby the displacement characteristic of the piezoelectric actuator is high.

In a piezoelectric actuator according to the present invention, it is preferable that the piezoelectric body is a chip made by cutting an aggregate substrate, and the four side surfaces are cut surfaces of the aggregate substrate.

A piezoelectric actuator according to the present invention, it is preferable that the coating layer is in contact with bottoms of the recessed portions in the four side surfaces.

The present invention provides a magnetic disc apparatus on which the piezoelectric actuator of any one of the above configurations is mounted.

In this case, in the piezoelectric actuator, ceramic particles are prevented from falling off the piezoelectric body; thus, it is not necessary to further provide a coating layer on the surface of the piezoelectric actuator after the piezoelectric actuator is mounted on the magnetic disc apparatus.

The present invention further provides a method for manufacturing a piezoelectric actuator configured in the following manner.

A method for manufacturing a piezoelectric actuator includes first to sixth steps. In the first step, an aggregate substrate is prepared in which a metal layer is provided on each of two mutually opposed surfaces of a piezoelectric mother substrate made of piezoelectric ceramic. In the second step, a film having adhesiveness is stuck to the aggregate substrate, and the aggregate substrate is fixed on a reference plane via the film. In the third step, a mask is provided on the fixed aggregate substrate. In the fourth step, the aggregate substrate is cut together with the mask to provide grooves to form a plurality of chips having cuboid shapes. In the fifth step, uncured resin is applied to cut surfaces of the plurality of chips, and the applied uncured resin is then cured to provide a coating layer. In the sixth step, the mask is removed from the chips, and the chips are removed from the film.

By the above process, a piezoelectric actuator is manufactured in which, of six surfaces of the piezoelectric body, the mutually opposed two surfaces are covered with the metal layers, and other four surfaces are covered with the coating layer.

In the method for manufacturing a piezoelectric actuator according to the present invention, it is preferable that a viscosity of the uncured resin is greater than 1 mPa·s and less than 100 mPa·s.

Preferably, a seventh step is further provided after the first step and before the second step. In the seventh step, a reinforcing member pattern made of resin is provided on at least one of the metal layers on the aggregate substrate such that the reinforcing member pattern protrudes from both sides of parts at which the grooves are to be formed in the fourth step. The reinforcing member pattern which is cut in the fourth step together with the mask and the aggregate substrate is a reinforcing member.

In this case, because the end part of at least one of the external electrodes is covered with the reinforcing member and the coating layer, the piezoelectric actuator is strong at the corners thereof.

Preferably, in the fifth step, the uncured resin gets in a gap between the film and the aggregate substrate or the reinforcing member pattern and then gets cured to become the reinforcing member.

Preferably, in the third step, the mask is a second film, and in the fifth step, the uncured resin gets in a gap between the second film and the aggregate substrate or the reinforcing member pattern and then gets cured to become the reinforcing member.

With the present invention, piezoelectric ceramic particles are surely prevented from falling off the piezoelectric body.

BRIEF DESCRIPTION OF THE DRAWINGS

FIG. 6 is a graph showing a result of a tape test of the piezoelectric actuators according to Example 1 of the present invention and the piezoelectric actuators according to Comparative Example 1.

FIGS. 11E and 11F are enlarged cross sectional views of a main part showing the manufacturing process of the piezoelectric actuator according to modified example 1 of the first embodiment of the present invention.

DETAILED DESCRIPTION OF THE INVENTION

Hereinafter, an embodiment of the present invention will be described with reference to FIG. 1A to FIG. 18G.

First Embodiment

A piezoelectric actuator 10 according to a first embodiment of the present invention will be described with reference to FIG. 1A to FIG. 10.

Figure 1A:
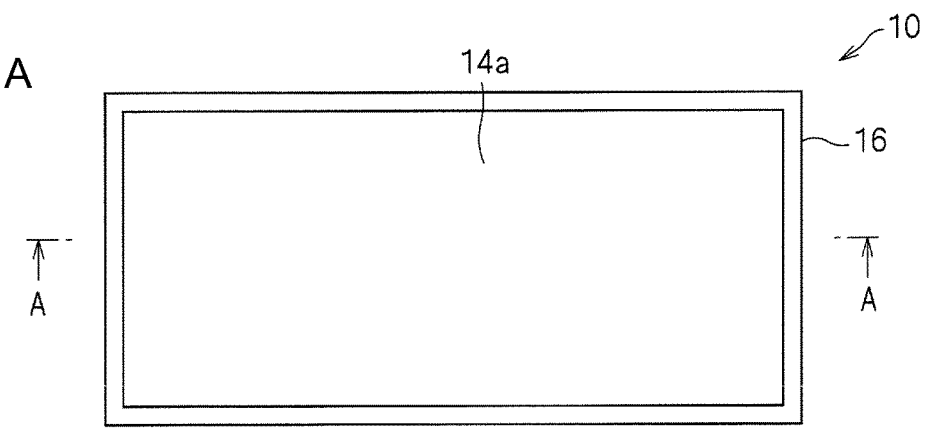
FIG. 1A is a plan view of a piezoelectric actuator according to a first embodiment of the present invention.
Figure 1B:
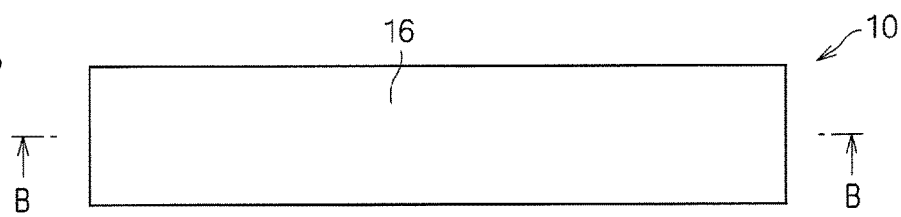
FIG. 1B is a side view of the piezoelectric actuator according to the first embodiment of the present invention.
Figure 1C:
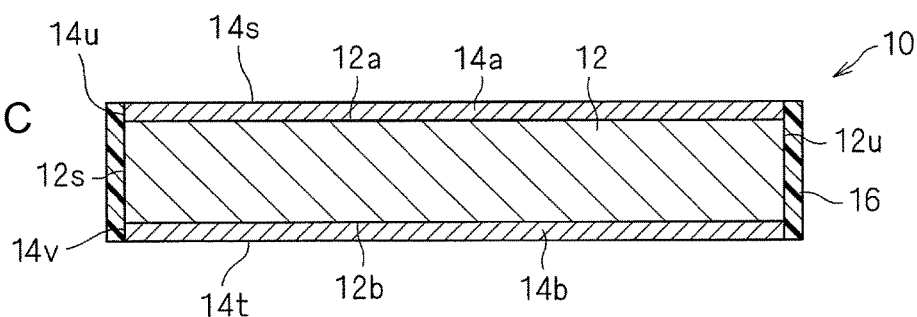
FIG. 1C is a cross sectional view of the piezoelectric actuator according to the first embodiment of the present invention.
Figure 1D:
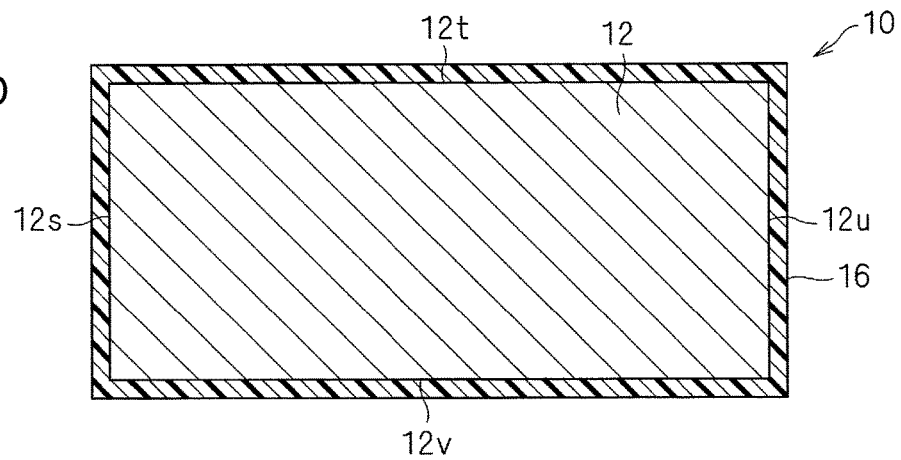
FIG. 1D is a cross sectional view of the piezoelectric actuator according to the first embodiment of the present invention.
Figure 10:
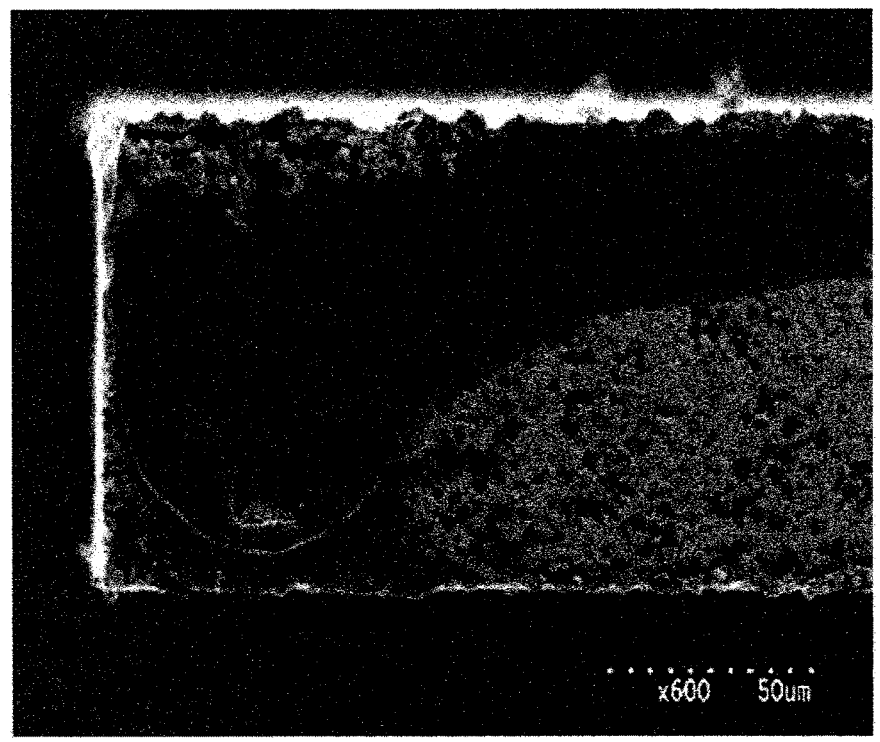
FIG. 10 is a scanning electron microscopic photograph of the side surface of the piezoelectric body of the piezoelectric actuator according to Example 4.

FIG. 1A is a plan view of the piezoelectric actuator 10, FIG. 10 is a side view, FIG. 10 is a cross sectional view cut along line A-A of FIG. 1A, and FIG. 1D is a cross sectional view cut along line B-B of FIG. 1B. As shown in FIGS. 1A to 1D, the piezoelectric piezoelectric actuator 10 is equipped with a piezoelectric body 12, a pair of external electrodes 14a and 14b, and a coating layer 16.

The piezoelectric body 12 is made of piezoelectric ceramic such as lead zirconate titanate (PZT), has a cuboid shape, and has six surfaces 12a, 12b, 12s to 12v. The mutually opposed two surfaces 12a and 12b of the piezoelectric body 12 represent mutually opposed two principal surfaces 12a and 12b. The other four surfaces 12s to 12v of the piezoelectric body 12 represent the four side surfaces 12s to 12v which connect the two principal surfaces 12a and 12b.

On the two principal surfaces 12a and 12b of the piezoelectric body 12, the external electrodes 14a and 14h configured with, for example, a layer made of NiCr and a layer made of Au are disposed. The four side surfaces 12s to 12v of the piezoelectric body 12 are covered with the coating layer 16 made of resin such as epoxy and polyimide. The six surfaces 12a, 12b, 12s to 12v of the piezoelectric body 12 are each covered on every part with any of the external electrodes 14a and 14b and the coating layer 16. The coating layers 16 also cover outer peripheral surfaces 14u and 14v of the external electrodes 14a and 14b.

As shown in FIG. 1C, all parts of the surfaces 14s and 14t, of the external electrodes 14a and 14b, opposite to the surfaces which are in contact with the piezoelectric body 12 are externally exposed and not covered with the coating layer 16. Thus, the external electrodes 14a and 14b can be easily connected to an electrode of a magnetic disc apparatus on which the piezoelectric actuator 10 is mounted or the like.

The all parts of the six surfaces 12a, 12b, 12s to 12v of the piezoelectric body 12 only have to be covered with any of the external electrodes 14a and 14b and the coating layer 16. It does not matter if a part of the two principal surfaces 12a and 12b of the piezoelectric body 12 is covered with the coating layers 16 instead of the external electrodes 14a and 14b, and it does not matter if a part of the four side surfaces 12s to 12v of the piezoelectric body 12 is covered with the external electrodes 14a and 14b instead of the coating layer 16.

Figure 2:
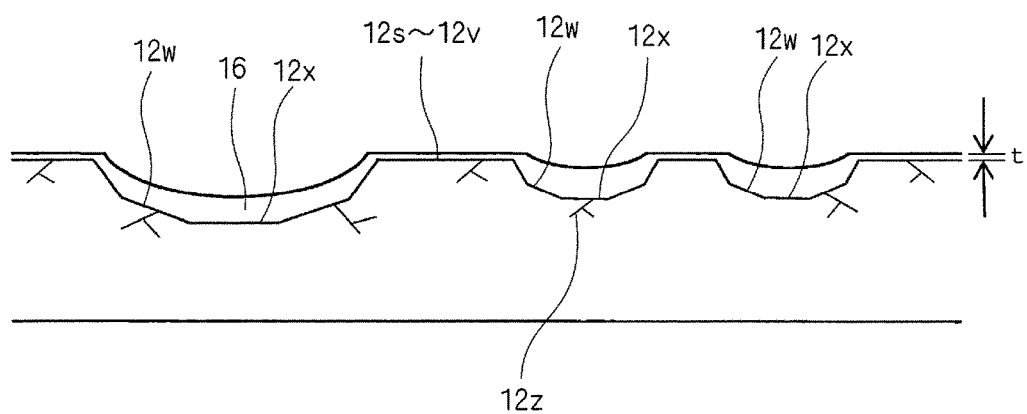
FIG. 2 is an enlarged cross sectional view of a main part of the piezoelectric actuator according to the first embodiment of the present invention.

FIG. 2 is an enlarged cross sectional view of a main part of the piezoelectric actuator 10. As schematically shown in FIG. 2, because the piezoelectric body 12 is made of piezoelectric ceramic, there are formed a lot of cracks 12z due to chipping caused by dicing be described later) and pores in the piezoelectric ceramic, in the four side surfaces 12s to 12v of the piezoelectric body 12 covered with the coating layer 16. Then, the cracks will develop, and the parts whose surfaces have fallen off are recessed portions 12w. In the surfaces of the side surfaces 12s to 12v and in the vicinities of the recessed portions 12w, such cracks 12z caused by the damage at the time of dicing are formed. These cracks 12z are thought to be one of the sources of piezoelectric ceramic particles falling off. Because the coating layer 16 is formed by applying low viscosity resin, the stuck resin is thick on the recessed portions 12w due to surface tension, whereby the resin covers the recessed portions 12w, being in contact with bottoms 12x of the recessed portions 12w. Because the coating layer 16 is provided not only on the flat parts of the four surfaces 12s to 12v of the piezoelectric body 12 but deep in the recessed portions 12w to be in contact with the bottoms 12x, the coating layer 16 is less likely to fall off the four side surfaces 12s to 12v of the piezoelectric body 12.

Thus, the state is surely held in which all parts of the six surfaces 12a, 12b, 12s to 12v of the piezoelectric body 12 are covered with any of the external electrodes 14a and 14b and the coating layer 16. As a result, piezoelectric ceramic particles are surely prevented from falling off the piezoelectric body 12.

The coating layer 16 is made of cured resin which has an uncured state viscosity of greater than 1 mPa·s and less than 100 mPa·s. As described later, when the viscosity of the uncured resin is greater than 1 mPa·s, the coating layer 16 can be provided in contact with the bottoms 12x of the recessed portions 12w of the piezoelectric body 12. When the viscosity of the uncured resin is less than 100 mPa·s, the thicknesses t of the coating layer 16 (see FIG. 2) on the four side surfaces 12s to 12v of the piezoelectric body 12 are prevented from getting too thick. The thickness t of the coating layer 16 represents the thickness of the coating layer 16 provided on the flat parts of the four side surfaces 12s to 12v of the piezoelectric body 12.

Next, the manufacturing process of the piezoelectric actuator 10 will be described with reference to FIG. 3A to FIG. 5D. FIGS. 3A, 3B, and 3C and FIGS. 4D, 4E, and 4F are enlarged cross sectional views of a main part showing the manufacturing process of the piezoelectric actuator 10. FIGS. 5A, 5B, 5C, and 5D are explanatory diagrams showing the manufacturing process of the piezoelectric actuator 10.

Figure 3A:
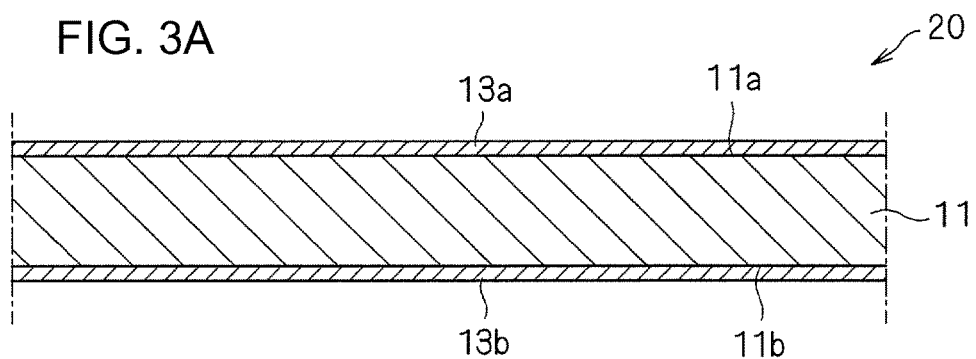
FIGS. 3A, 3B, and 3C are enlarged cross sectional views of a main part showing a manufacturing process of the piezoelectric actuator according to the first embodiment of the present invention.

First, as shown in FIG. 3A, an aggregate substrate 20 is prepared in which metal layers 13a and 13b are each provided entirely on each of two principal surfaces 11a and 11b of a piezoelectric mother substrate 11 made of piezoelectric ceramic. The metal layers 13a and 13b are each configured with stacked two layers, one made of NiCr and the other made of Au. The aggregate substrate 20 may be made in such a manner that, after the piezoelectric mother substrate 11 is produced, the metal layers 13a and 13b are provided, or in such a manner that the piezoelectric mother substrate 11 and the metal layers 13a and 13b are simultaneously provided by a method in which, after paste containing metal is applied to the both surfaces an unbaked ceramic green sheet, the sheet is baked, or by other methods. The piezoelectric mother substrate 11 includes a part which becomes the piezoelectric body 12 of the piezoelectric actuator 10, and the metal layers 13a and 13b include a part which becomes the external electrodes 14a and 14b of the piezoelectric actuator 10.

Figure 3B:
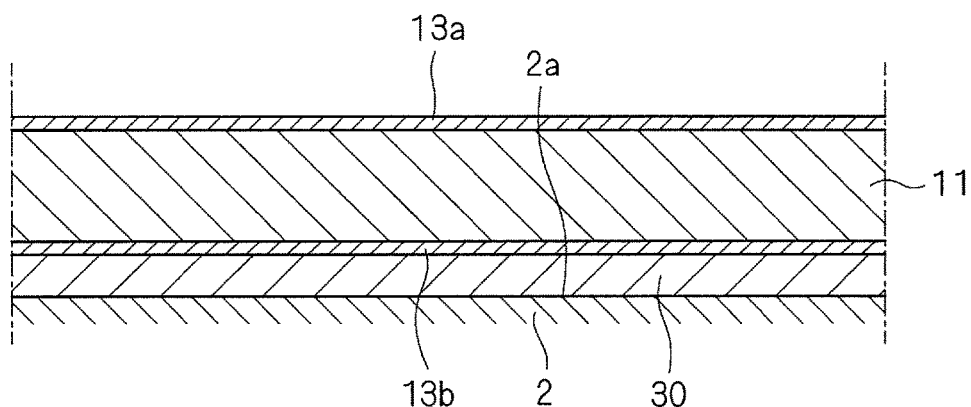
Figure 5A:
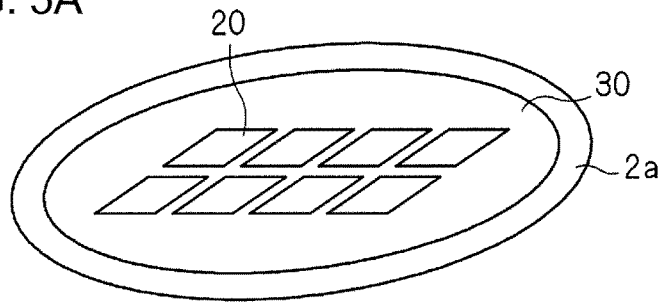
FIGS. 5A, 5B, 5C, and 5D are explanatory diagrams showing the manufacturing process of the piezoelectric actuator according to the first embodiment of the present invention.

Next, as shown in FIG. 3B and FIG. 5A, one or more aggregate substrates 20 are stuck to a dicing tape 30 as a film having adhesiveness, and the one or more aggregate substrates 20 are fixed on a reference plane 2a of a jig 2 via the dicing tape 30. At this time, the dicing tape 30 is attached to the aggregate substrates 20 such that the metal layers 13b are in contact with the dicing tape 30.

Figure 3C:
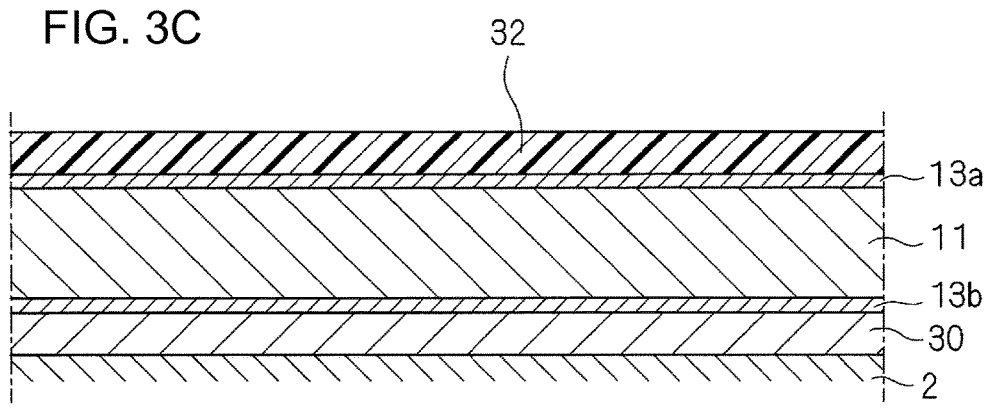
Figure 5B:
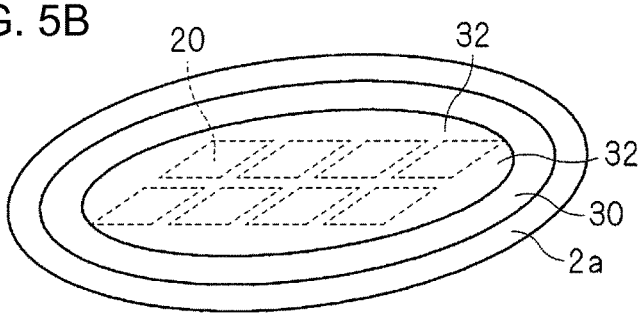

Next, as shown in FIG. 3C and FIG. 5B, mask material made of resin is applied on the aggregate substrate 20 to provide a mask 32 which covers the metal layer 13a.

Figure 4D:
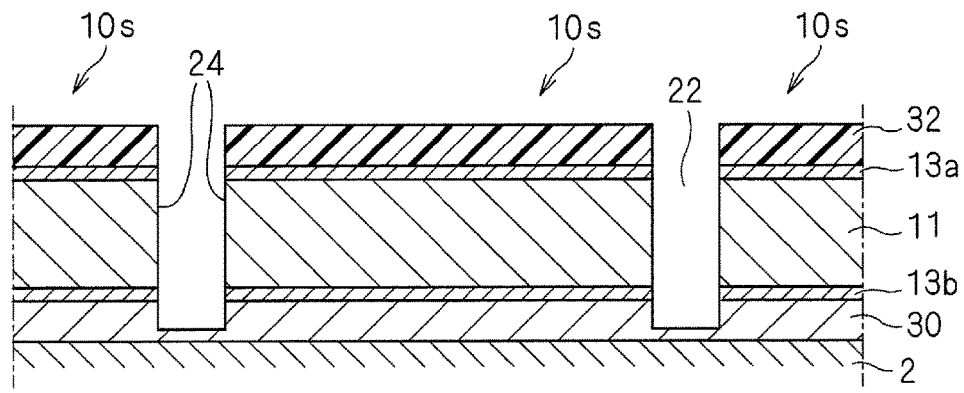
FIGS. 4D, 4E, and 4F are enlarged cross sectional views of a main part showing the manufacturing process of the piezoelectric actuator according to the first embodiment of the present invention.
Figure 5C:
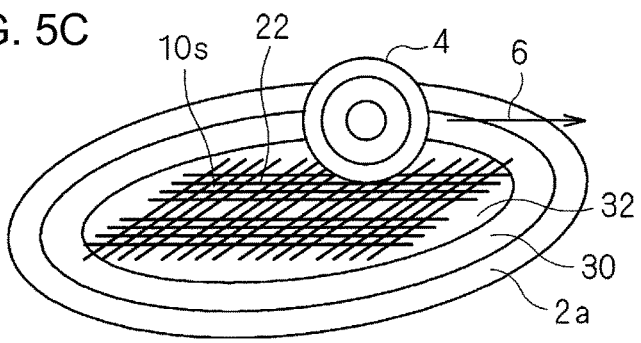

Next, as shown in FIG. 4D and FIG. 5C, by dicing with a dicing blade 4 being displaced as indicated by arrow 6 or by laser machining or the like, the piezoelectric mother substrate 11 is cut together with the mask 32 and the metal layers 13a and 13b, whereby grooves 22 are formed in the aggregate substrate 20 to divide the aggregate substrate 20 into a plurality of chips 10s having cuboid shapes. With respect to the neighboring chips 10s, the cut surfaces 24 are facing each other, and the grooves 22 are formed between the facing cut surfaces 24. In the cut surfaces 24 of the piezoelectric mother substrate 11, there are chippings due to the dicing and a plurality of recessed portions due to pores in the piezoelectric ceramic and other causes.

Figure 5D:
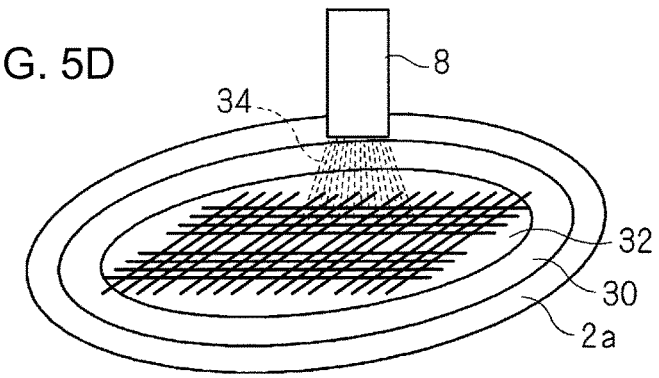

Next, as shown in FIG. 5D, uncured resin 34 is applied to the cut surfaces 24 of the chips 10s by using a spray 8 or the like. At this time, when the uncured resin 34 having a viscosity of greater than 1 mPa·s and less than 100 mPa·s is applied, the uncured resin 34 gets into a plurality of recessed portions in the cut surface 24 of the piezoelectric mother substrate 11 by a capillary action, whereby the recessed portions are filled with the uncured resin 34.

In particular, a degassing treatment of leaving for a predetermined time in a vacuum state is effective to remove bubbles which are formed, at the time of applying the uncured resin, in the uncured resin or in the interface between the uncured resin and the cut surfaces 24 of the piezoelectric mother substrate 11.

Figure 4E:
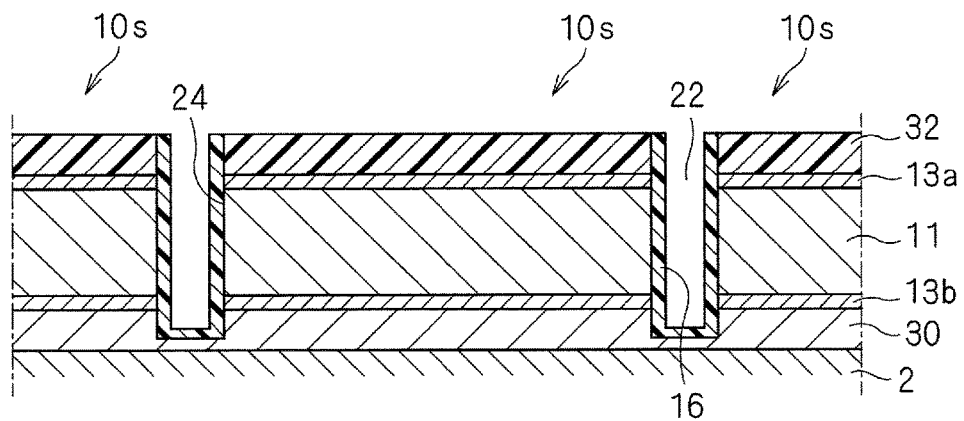

Next, as shown in FIG. 4E, the uncured resin 34 is cured by heating, irradiation of ultra violet, or the like to provide the coating layers 16.

Figure 4F:
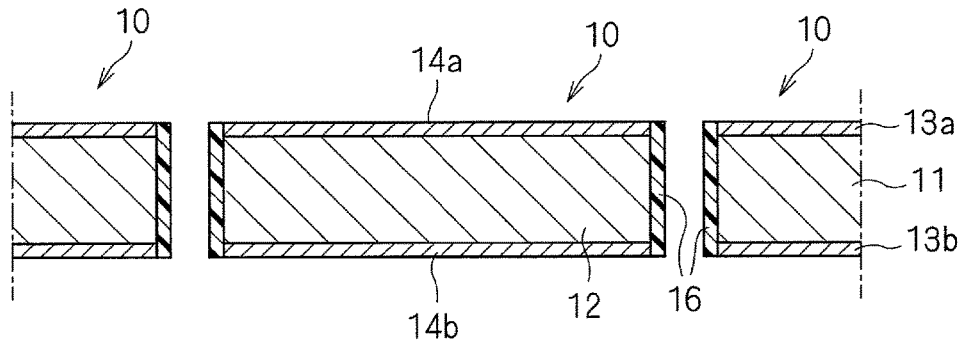

Next, as shown in FIG. 4F, the masks 32 are removed, and individual piezoelectric actuators 10 are removed from the dicing tape 30 and picked up.

Next, a description will be made about a test conducted with the piezoelectric actuators of Example 1 manufactured by the above-described manufacturing process.

As the first test, a tape test was conducted with the piezoelectric actuators of Example 1 manufactured by the above-described manufacturing process. Thirty chips of piezoelectric actuators of Example 1 manufactured with the resin 34 having an uncured-state viscosity of 10 mPa·s and three chips of the piezoelectric actuators of Comparative Example 1 were prepared to conduct the tape test. The piezoelectric actuators of Comparative Example 1 were different from the piezoelectric actuators of Example 1 only in that the Comparative Example 1 did not have a coating layer. In particular, after a tape having adhesiveness was pressed against the four side surfaces 12s to 12v of the piezoelectric body 12, a part of 200 μm width was enlarged with a scanning electron microscope, and the number of the piezoelectric ceramic particles stuck to the tape, in other words, the piezoelectric ceramic particles having fallen off the piezoelectric body 12 was counted. The graph of FIG. 6 shows the test result.

FIG. 6 shows that the numbers of the piezoelectric ceramic particles having fallen off the piezoelectric body 12 of the piezoelectric actuator of Example 1 are very small compared to the piezoelectric actuators of Comparative Example 1, which have no coating layer.

Figure 7:
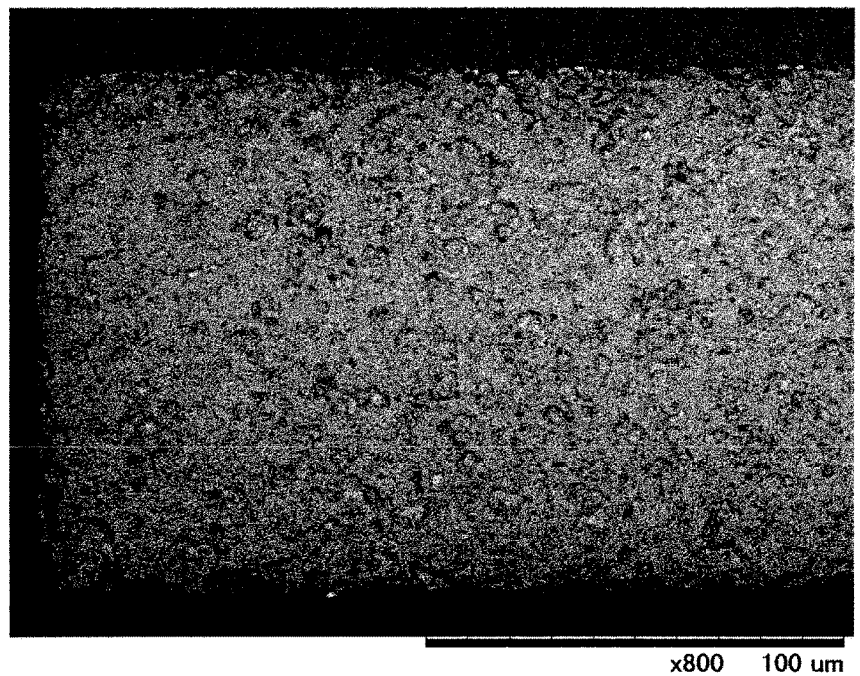
FIG. 7 is a photograph of the side surface of the piezoelectric body of the piezoelectric actuator according to Example 3.
Figure 8:
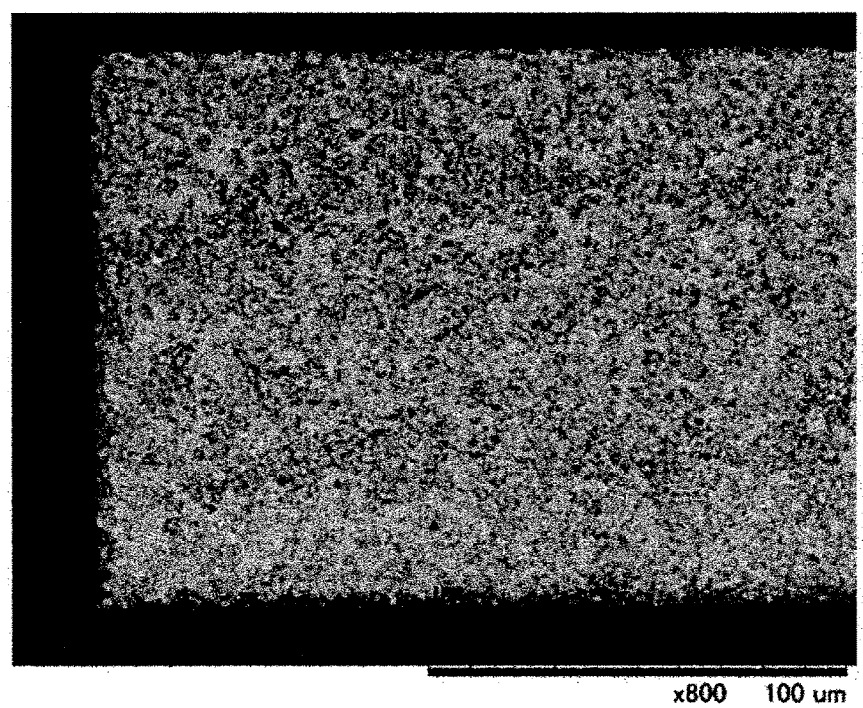
FIG. 8 is a photograph of the side surface of the piezoelectric body of the piezoelectric actuator according to Example 2 of the present invention.
Figure 9:
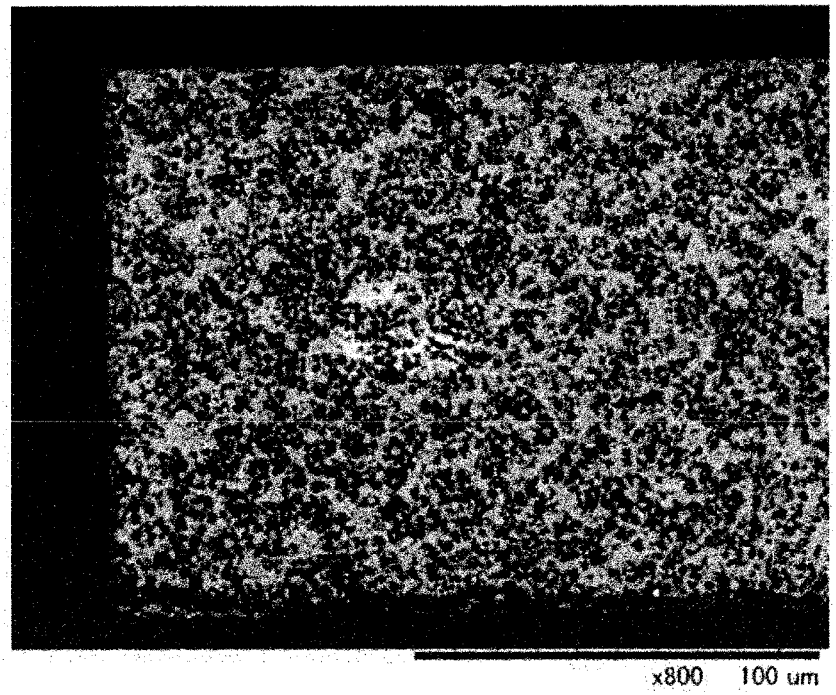
FIG. 9 is a photograph of the side surface of the piezoelectric body of the piezoelectric actuator according to Example 1 of the present invention.

As the second test, uncured resins having different viscosities were applied to the side surfaces of the piezoelectric body, the cured resins were observed. In particular, in addition to the piezoelectric actuator of Example 1 above, there were prepared a piezoelectric actuator of Example 2, which was manufactured by using the resin 34 with an uncured-state viscosity of 5 mPa·s, a piezoelectric actuator of Example 3, which was different from Examples 1 and 2 in that the actuator was manufactured by using resin with an uncured-state viscosity of 1 mPa·s, and a piezoelectric actuator of Example 4, which was different from Example 1 and 2 in that the actuator was manufactured by using resin having an uncured-state viscosity of 100 mPa·s. FIG. 7 is a photograph of the side surface of the piezoelectric body of the piezoelectric actuator according to Example 3. FIG. 8 is a photograph of the side surface of the piezoelectric body of the piezoelectric actuator according to Example 2. FIG. 9 is a photograph of the side surface of the piezoelectric body of the piezoelectric actuator according to Example 1. FIG. 10 is a scanning electron microscope photograph of the side surface of the piezoelectric body of the piezoelectric actuator according to Example 4. In FIG. 7 to FIG. 10, the relatively thick parts of the resin look dark.

As shown in FIG. 7, in the piezoelectric actuator according to Example 3, because not many dark parts are visible in the recessed portions, it can be understood that the coating layer does not get in much enough to cover the bottoms of the recessed portions of the piezoelectric body, and the coating layer is not sufficiently in contact with the bottoms of the recessed portions 12. As shown in FIG. 8 and FIG. 9, in the piezoelectric actuators according to Examples 1 and 2, because the dark parts are visible in the recessed portions, it can be understood that the coating layer 16 gets in much enough to cover the bottoms 12x of the recessed portions 12w of the piezoelectric body 12, and the coating layer 16 is sufficiently in contact with the bottoms 12x of the recessed portions 12w. As shown in FIG. 10, in the piezoelectric actuator according to Example 4, because the coating layer does not only cover the recessed portions but hangs down, covering a large part of the side surface of the piezoelectric body, it can be understood that the thickness of the coating layer is not even. FIG. 7 to FIG. 10 show that it is preferable that the viscosity of the uncured resin 34 is greater than 1 mPa·s and less than 100 mPa·s. If the viscosity of the uncured resin 34 is 5 mPa·s or greater and 15 mPa·s or less, it is more preferable, because the thickness t of the coating layer 16 can be kept 1 μm or less and it is easy for the resin to be sufficiently in contact with the bottoms of the recessed portions 12w.

The above-described piezoelectric actuator 10 according to the first embodiment of the present invention can be suitably mounted on a magnetic disc apparatus.

In particular, in the piezoelectric actuator 10 according to the first embodiment of the present invention, the six surfaces 12a, 12b, 12s to 12v of the piezoelectric body 12 are covered any of the external electrodes 14a and 14b and the coating layer 16 made of resin; thus, it is not necessary to cover the surface of the piezoelectric actuator 10 with the coating layer after the piezoelectric actuator 10 is mounted on the suspension of the magnetic disc apparatus. Thus, resin does not stick to unintended places (for example, in the vicinity of the magnetic head) in the magnetic disc apparatus, and accordingly the reliability of the magnetic disc apparatus is improved. In addition, the manufacturing process of the magnetic disc apparatus is simplified; accordingly, the yield rate is increased, and the production cost is reduced.

Further, in the piezoelectric actuator 10 according to the first embodiment of the present invention, the coating layer 16 is in contact with the bottoms 12x of the recessed portions 12w of the piezoelectric body 12; thus, the coating layer 16 is less likely to fall off, whereby the piezoelectric ceramic particles is further surely prevented from falling off the piezoelectric body 12. In addition, because the coating layer 16 is in contact with the bottoms 12x of the recessed portions 12w of the piezoelectric body 12, cracks are less likely to occur in the piezoelectric body 12.

In the piezoelectric actuator 10 according to the first embodiment of the present invention, because the resin 34 with an uncured-state viscosity of greater than 1 mPa·s and less than 100 mPa·s is used to provide the coating layer 16; thus, the uncured resin 34 gets in to the bottoms 12x of the recessed portions 12w of the piezoelectric body 12 due to a capillary action, whereby the coating layer 16 is surely in contact with the bottoms 12x of the recessed portions 12w of the piezoelectric body 12.

In the piezoelectric actuator 10 according to the first embodiment of the present invention, if the thicknesses t of the coating layer 16 (except the coating layer provided on the recessed portions 12w) are 1 μm or less on the four side surfaces 12s to 12v of the piezoelectric body 12, the coating layer 16 hardly inhibits the displacement of the piezoelectric actuator 10, whereby the displacement characteristic of the piezoelectric actuator 10 can be high. As a result, in the magnetic disc apparatus on which the piezoelectric actuator 10 according to the first embodiment of the present invention having the thickness of the coating layer 16 of 1 μm or less is mounted, the magnetic head can be moved with a high degree of accuracy. In addition, because the thickness of the coating layer 16 is thin, the piezoelectric actuator 10 can be downsized.

Modified Example 1 of the First Embodiment

As shown in FIG. 11E, when the uncured resin is applied in the manufacturing process of the piezoelectric actuator, the adhesion between the dicing tape 30 and metal layers 13b can be low or a gap can be created between the dicing tape 30 and the metal layers 13b, depending on the dicing conditions and the viscosity of the dicing tape 30, whereby the low viscosity resin gets in between the dicing tape 30 and the metal layers 13b and is then cured. Due to the cured resins 16m, reinforcing members 18m, are integrally formed together with the coating layers 16 in the piezoelectric actuators 10m as shown in FIG. 11F.

Modified Example 2 of the First Embodiment

Figure 12:
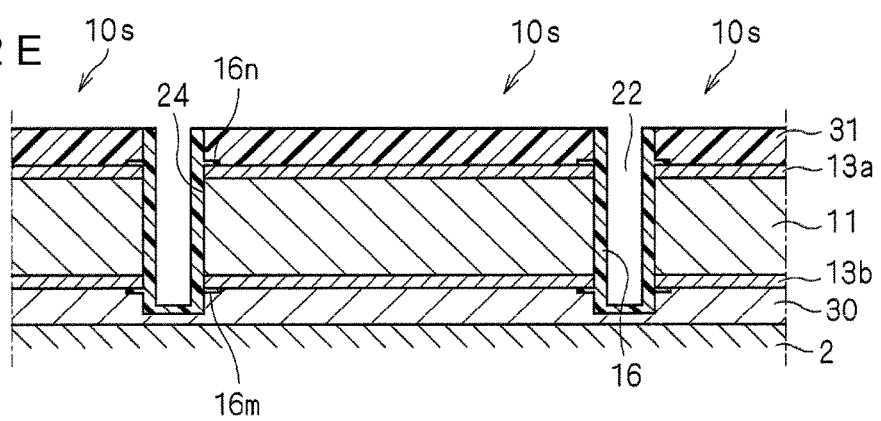
FIGS. 12E and 12F are enlarged cross sectional views of a main part showing the manufacturing process of the piezoelectric actuator according to modified example 2 of the first embodiment of the present invention.
Figure 12F:
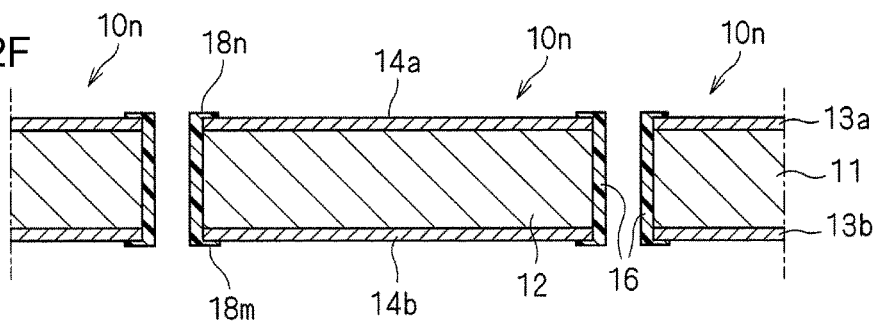

As shown in FIG. 12E, second films 31 having adhesiveness like the dicing tape 30 are stuck, as masks, to the metal layers 13a to cover the metal layers 13a, and the uncured resin is then applied. The uncured resin gets in between the dicing tape 30 and the metal layers 13b and is then cured, and at the same time, the low viscosity resin may also get in between the second films 31 and the metal layers 13a and may then be cured, depending on the dicing conditions and the viscosity of the second film 31. The cured resins 16m and 16n are used to integrally form the reinforcing members 18m and 18n together with the coating layers 16 on both of the upper and lower surfaces of the piezoelectric actuators 10n as shown in FIG. 12F.

Second Embodiment

A piezoelectric actuator 10a according to a second embodiment of the present invention will be described with reference to FIG. 13A to FIG. 16B.

Figure 13A:
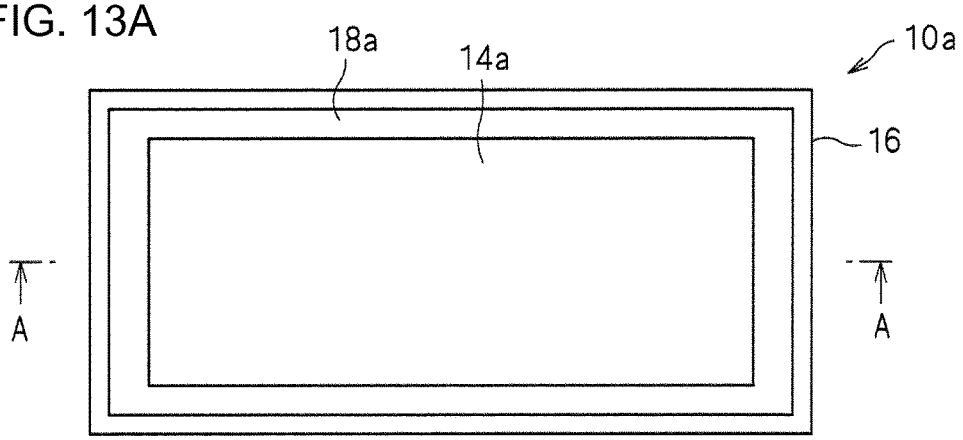
FIG. 13A is a plan view of the piezoelectric actuator according to a second embodiment of the present invention.
Figure 13B:
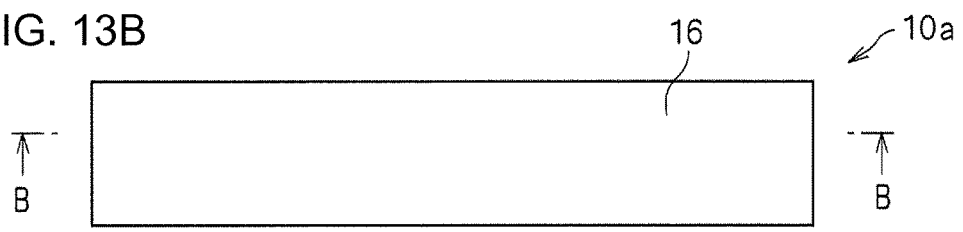
FIG. 13B is a side view of the piezoelectric actuator according to the second embodiment of the present invention.
Figure 13C:
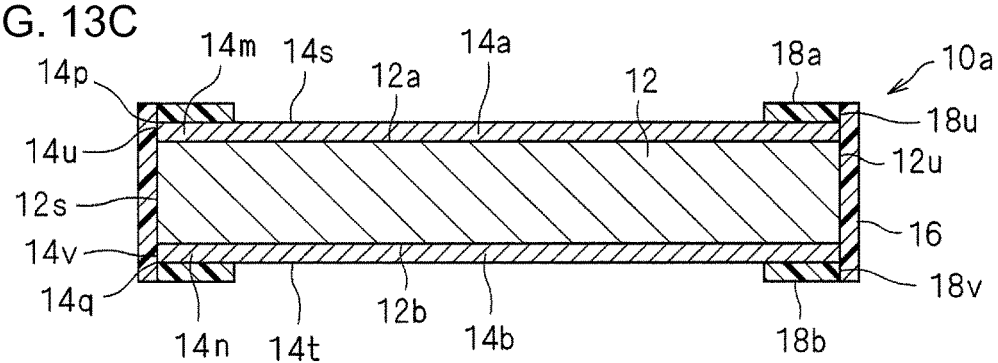
FIG. 13C is a cross sectional view of the piezoelectric actuator according to the second embodiment of the present invention.
Figure 13D:
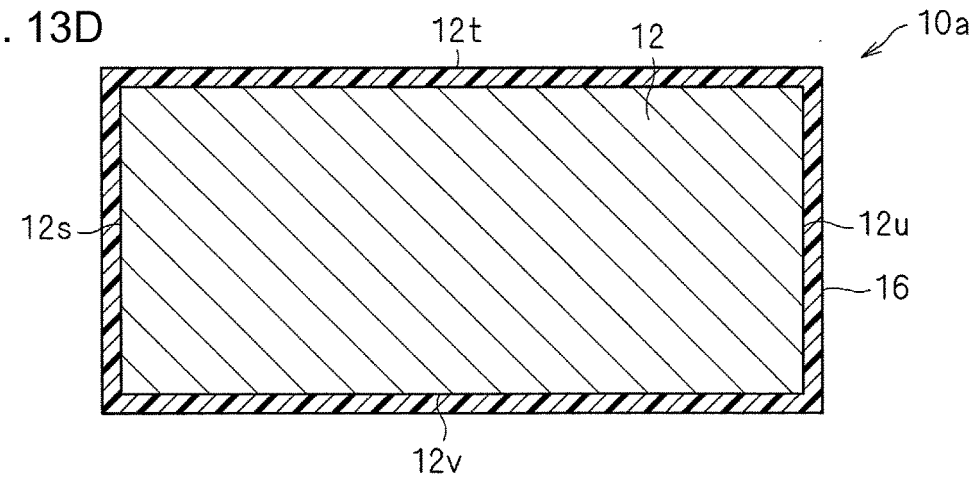
FIG. 13D is a cross sectional view of the piezoelectric actuator according to the second embodiment of the present invention.

FIG. 13A is a plan view of the piezoelectric actuator 10a, FIG. 13B is a side view, FIG. 13C is a cross sectional view cut along line A-A of FIG. 13A, and FIG. 13D is a cross sectional view cut along line B-B of FIG. 13B. The piezoelectric actuator 10a is configured approximately in the same manner as the piezoelectric actuator 10 according to the first embodiment, and can be manufactured by approximately the same method. Hereinafter, the same structural parts as in the first embodiment are denoted by the same reference numerals, and will be described mainly about the differences from the first embodiment.

As shown in FIGS. 13A to 13D, the piezoelectric actuator 10a according to the second embodiment is different from the piezoelectric actuator 10 according to the first embodiment in that the piezoelectric actuator 10a further comprises reinforcing members 18a and 18b, and the coating layer 16 is provided to cover parts of the reinforcing members 18a and 18b. The reinforcing members 18a and 18b are made of resin and are provided, in frame shapes, on the surface 14s and 14t and along the peripheries 14p and 14q on the surface 14s and 14t, which are, of the surfaces of the external electrodes 14a and 14b, opposite to the surfaces in contact with the piezoelectric body 12.

The coating layer 16 covers the four side surfaces 12s to 12v of the piezoelectric body 12, the outer peripheral surfaces 14u and 14v of the external electrodes 14a and 14b, and the outer peripheral surfaces 18*u* and 18*v* of the reinforcing members 18*a* and 18*b*.

In the piezoelectric actuator 10*a* according to the second embodiment, the external electrodes 14*a* and 14*b* are covered with the reinforcing members 18*a* and 18*b* and the coating layer 16 on end parts 14*m* and 14*n* in the vicinities of the peripheries 14*p* and 14*q*. Thus, the piezoelectric actuator 10*a* is strong at the corners.

The other configuration of the piezoelectric actuator 10*a* is the same as in the piezoelectric actuator 10 according to the first embodiment.

Next, the manufacturing process of the piezoelectric actuator 10*a* will be described with reference to FIG. 14A to FIG. 16B. FIGS. 14A, 14B, 14G, and 14D and FIGS. 15E, 15F and 15G are enlarged cross sectional views of a main part showing the manufacturing process of the piezoelectric actuator 10*a*. FIGS. 16*a* and 16B are plan views of a main part showing the manufacturing process of the piezoelectric actuator 10*a*.

Figure 14A:
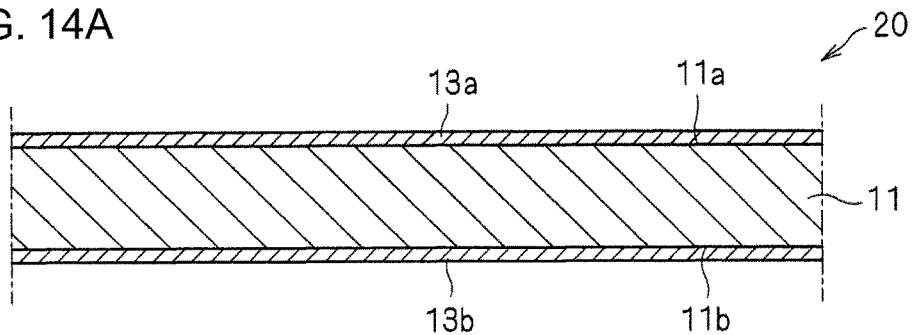
FIGS. 14A, 14B, 14C, and 14D are enlarged cross sectional views of a main part showing the manufacturing process of the piezoelectric actuator according to the second embodiment of the present invention.

In a similar way as the first embodiment, the aggregate substrate 20 is first prepared as shown in FIG. 14A.

Figure 14B:
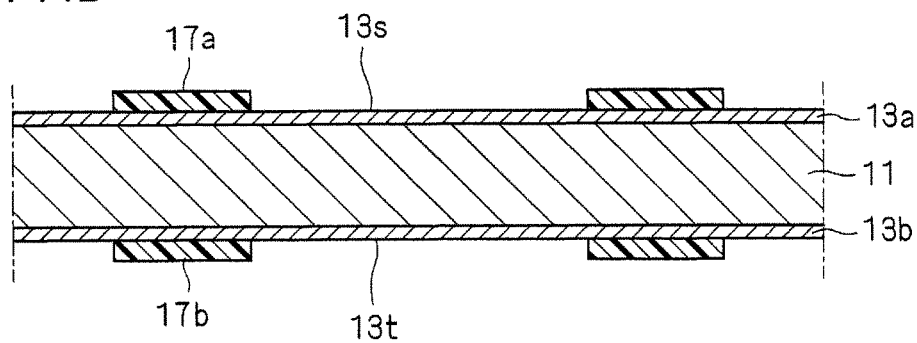
Figure 14C:
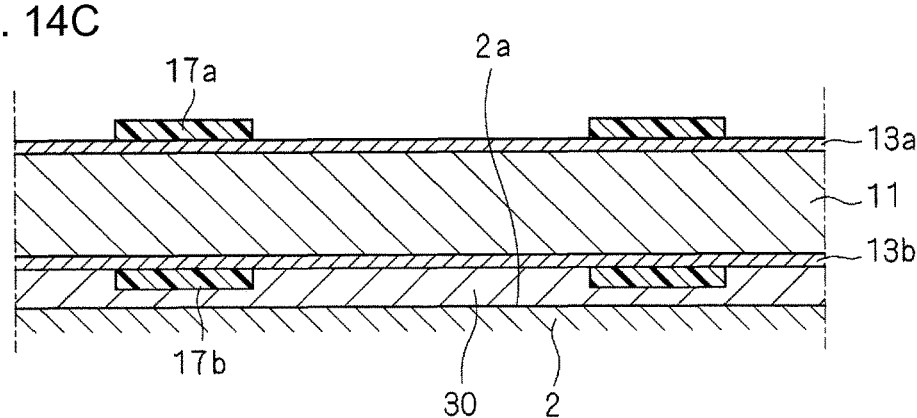

Next, as shown in FIG. 14B and FIG. 16A, reinforcing member patterns 17*a* and 17*b* are provided on the metal layers 13*a* and 13*b*. The reinforcing member patterns 17*a* and 17*b* are provided by a methods of printing, application, or the like, with a patterning material made of resin such as epoxy and polyimide. The reinforcing member patterns 17*a* and 17*h* are provided, at the positions corresponding to the grooves 22 to be formed in the following step, to have a width wider than the width of the grooves 22, and to protrude from the both sides of the parts on which the grooves 22 are to be formed so that the reinforcing member patterns 17*a* and 17*b* include the parts which will be the reinforcing members 18*a* and 18*b* of the piezoelectric actuator 10*a*.

Next, as shown in FIG. 14G, one or more aggregate substrates 20 are stuck to a dicing tape 30 having adhesiveness, and the one or more aggregate substrates 20 are fixed on the reference plane 2*a* of the jig 2 via the dicing tape 30. At this time, the dicing tape 30 is stuck to the aggregate substrate 20 such that the metal layers 13*b* and reinforcing member patterns 17*b* are in contact with the dicing tape 30.

Figure 14D:
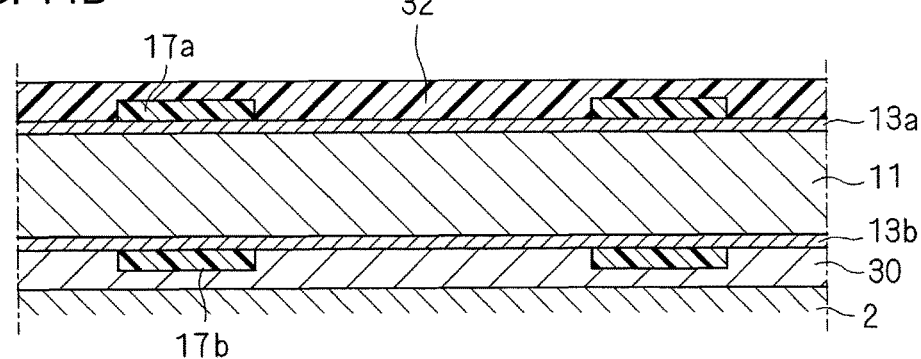

Next, as shown in FIG. 14D, mask material made of resin is applied on the aggregate substrate 20 to provide a mask 32 which covers the metal layer 13*a* and the reinforcing member patterns 17*a*.

Figure 15E:
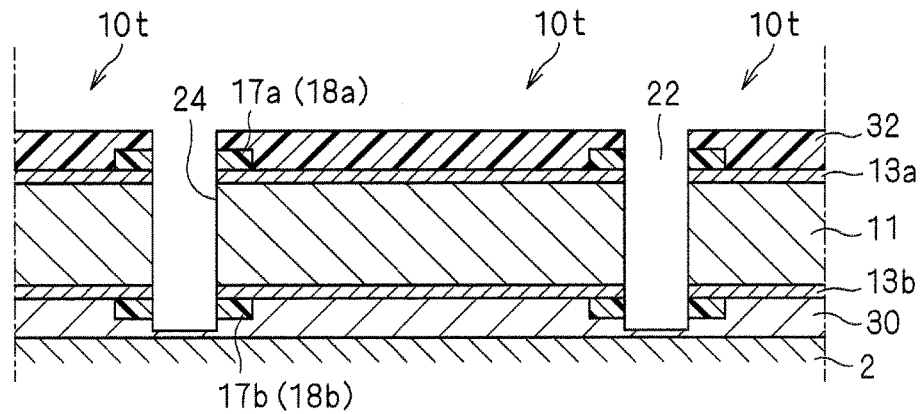
FIGS. 15E, 15F, and 15G are enlarged cross sectional views of a main part showing the manufacturing process of the piezoelectric actuator according to the second embodiment of the present invention.
Figure 16A:
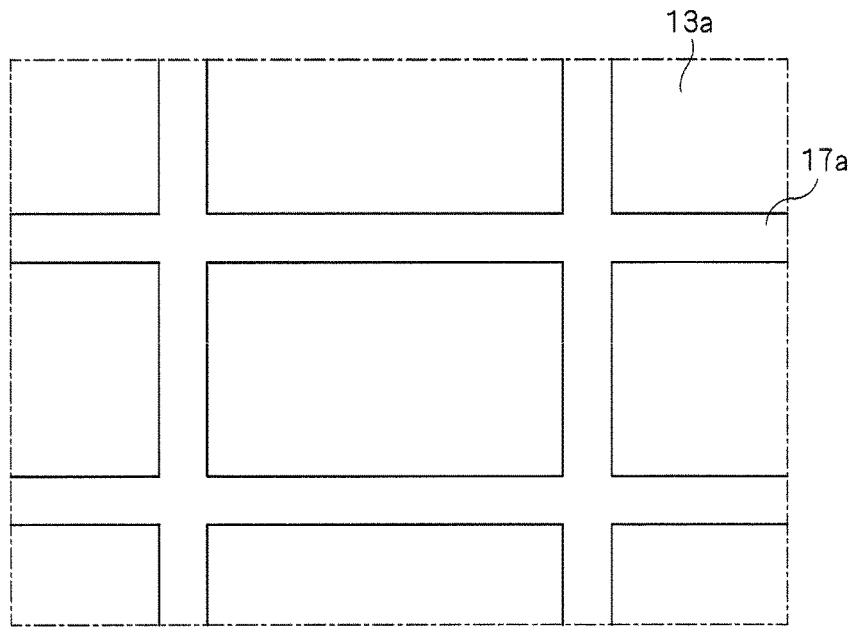
FIGS. 16A and 16B are plan views of a main part showing the manufacturing process of the piezoelectric actuator according to the second embodiment of the present invention.
Figure 16B:
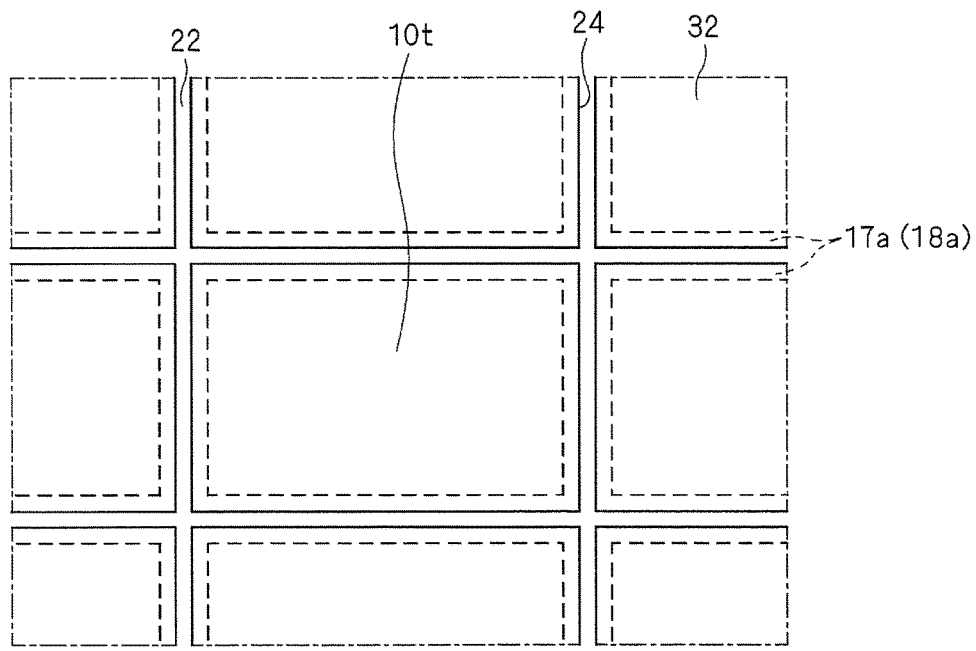

Next, as shown in FIG. 15E and FIG. 16B, by dicing, laser machining, or other methods, the piezoelectric mother substrate 11 is cut together with the mask 32, the reinforcing member patterns 17*a* and 17*b* and the metal layers 13*a* and 13*b*, whereby grooves 22 are formed in the aggregate substrate 20 to divide the aggregate substrate 20 into a plurality of chips 10*t* having cuboid shapes. With respect to the neighboring chips 10*t*, the cut surfaces 24 are opposed to each other, and the grooves 22 are formed between the opposed cut surfaces 24. In the cut surfaces 24 of the piezoelectric mother substrate 11, there are chipping due to the dicing and a plurality of recessed portions due to the pores in the piezoelectric ceramic and other causes. At this time, the grooves 22 are formed, at the center parts of the reinforcing member patterns 17*a* and 17*h*, in the width direction; and the remaining reinforcing member patterns 17*a* and 17*b* are used to provide the reinforcing parts 16*a* and 18*b* on the both sides of the grooves 22 along the cut surfaces 24.

Figure 15F:
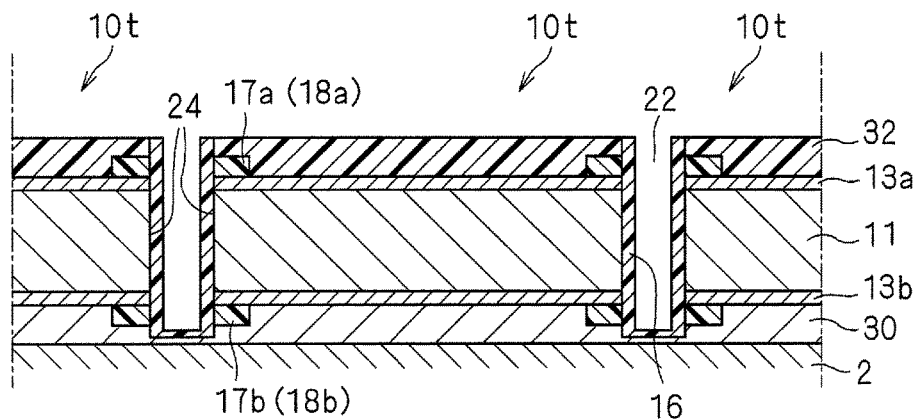

Next, uncured resin is applied to the cut surfaces 24 of the chips lot by using a spray or the like. At this time, when the uncured resin having a viscosity of greater than 1 mPa·s and less than 100 mPa·s is applied, the uncured resin gets into a plurality of recessed portions in the cut surfaces 24 of the piezoelectric mother substrate 11 by a capillary action, whereby the recessed portions are filled with the uncured resin. Next, as shown in FIG. 15F, the uncured resin is cured by heating, applying ultra violet, or the like to provide the coating layers 16. The coating layers 16 covers cut surfaces 24 of the piezoelectric mother substrates 11, the metal layers 13*a* and 13*b* and the reinforcing member patterns 17*a* and 17*b*.

Figure 15G:
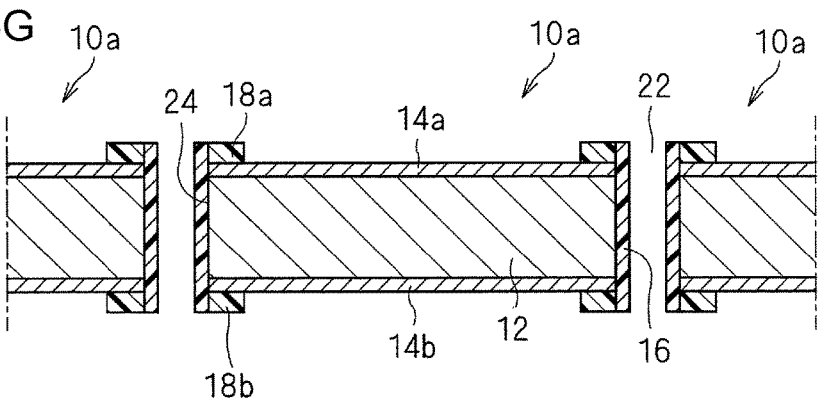

Next, as shown in FIG. 15G, the masks 32 are removed, and individual piezoelectric actuators 10*a* are removed from the dicing tape 30 and picked up.

When the piezoelectric actuator 10*a* is manufactured by the above-described manufacturing process, the reinforcing member patterns 17*a* and 17*b* are cut together with the piezoelectric mother substrate 11 and the metal layers 13*a* and 13*b*; thus, the cut surfaces of the piezoelectric mother substrate 11 get less damage when cut. As a result, in the cut surfaces of the piezoelectric mother substrate 11, in other words, the four side surfaces 12*s* to 12*v* of the piezoelectric body 12 of the piezoelectric actuator 10*a*, cracks are less likely to occur than in the first embodiment.

The piezoelectric actuator 10*a* according to the second embodiment can be mounted on the magnetic disc apparatus as appropriately as the piezoelectric actuator 10 according to the first embodiment.

Modified Example 1 of the Second Embodiment

Figure 17B:
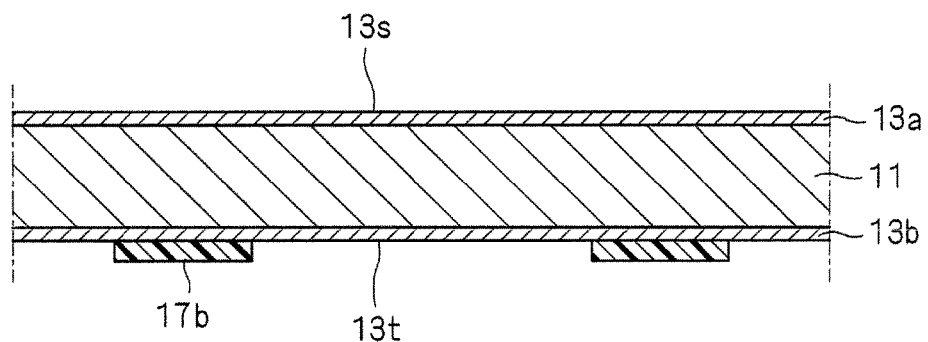
FIGS. 17B and 17G are enlarged cross sectional views of a main part showing the manufacturing process of the piezoelectric actuator according to modified example 1 of the second embodiment of the present invention.
Figure 17G:
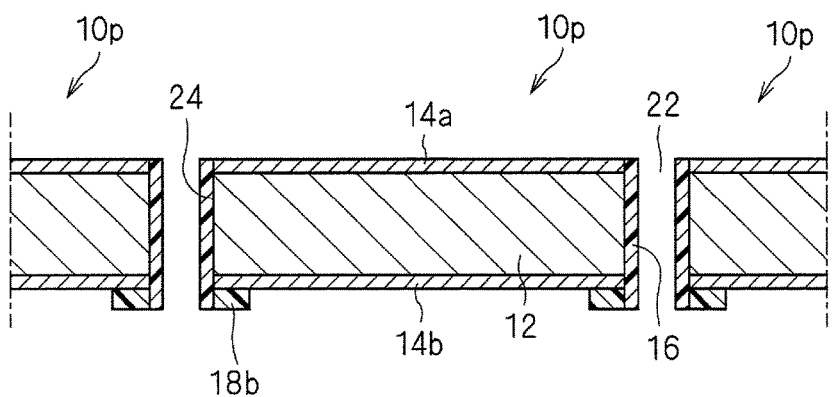

As shown in FIG. 17E, when the reinforcing member patterns 17*b* are provided on one metal layer 13*t*, and the reinforcing member patterns are not provided on the other metal layer 13*s*, the piezoelectric actuators 10*p* are manufactured in which reinforcing members 18*b* are formed only on one external electrodes 14*h* as shown in FIG. 17G.

Modified Example 2 of the Second Embodiment

Figure 18F:
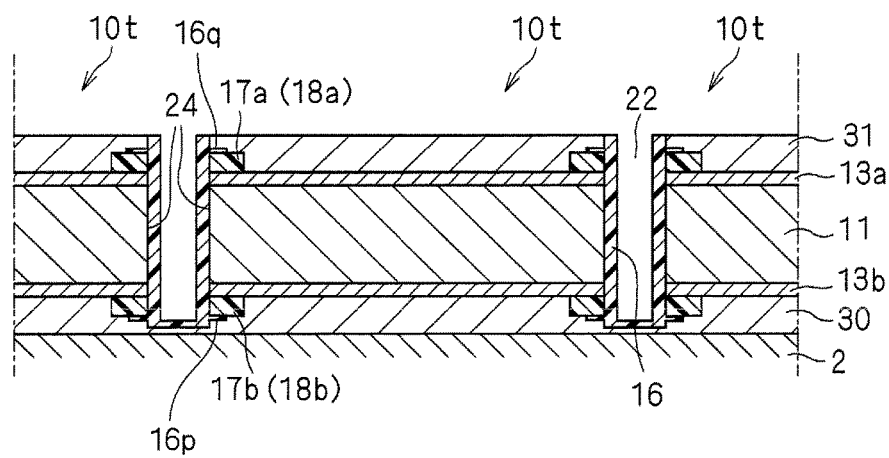
FIGS. 18F and 18G are plan views of a main part showing the manufacturing process of the piezoelectric actuator according to modified example 2 of the second embodiment of the present invention.
Figure 18G:
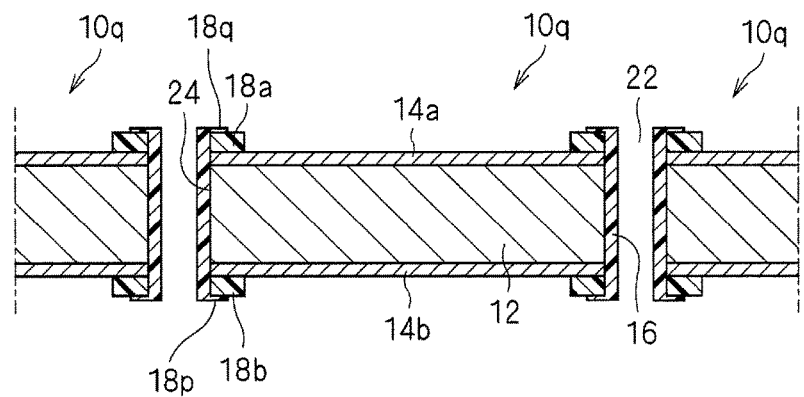
Figure 19:
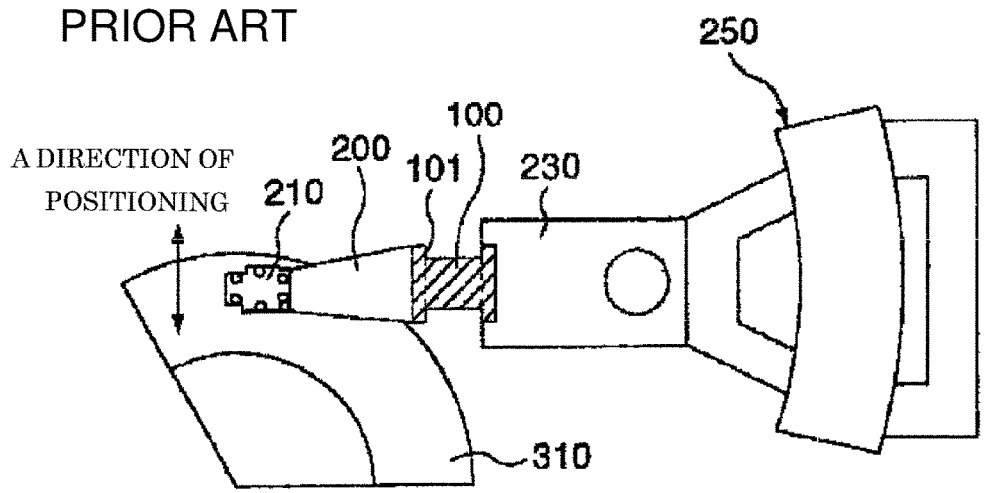
FIG. 19 is a plan view showing a configuration of a conventional magnetic disc apparatus.

As shown in FIG. 16F, in a manner similar to Modified Example 1 of the first embodiment, resins 16*p* get in between the dicing tape 30 and the reinforcing member patterns 17*b* and is then cured, wherein the cured resins 16 are used to integrally form reinforcing members 18*p* together with the coating layers 16 on reinforcing members 18*b* on the lower sides of the piezoelectric actuators 10*q* as shown in FIG. 18G. In addition, as shown in FIG. 18F, in a manner similar to Modified Example 2 of the first embodiment, resins 16*q* get in between the second films 31 stuck to the metal layers 13*a* and the reinforcing member patterns 17*a* and is then cured, wherein the cured resins 16*q* are used to integrally form reinforcing members 18*q* together with the coating layers 16 also on reinforcing members 18*a* on the upper sides of the piezoelectric actuators 10*q* as shown in FIG. 18G.

CONCLUSION

By providing the coating layer as described above, piezoelectric ceramic particles are surely prevented from falling off the piezoelectric body.

Note that the present invention is not limited to the above-described embodiments and can be carried out with various modifications added.

For example, the piezoelectric actuator of the present invention can be also used for applications other than the magnetic disc apparatus.

DESCRIPTION OF REFERENCE SYMBOLS

2 . . . Jig
2a . . . Reference plane
10, 10a, 10m, 10n, 10p, 10q . . . Piezoelectric actuator
10s, 10t . . . Chip
11 . . . Piezoelectric mother substrate
11a, 11b . . . Principal surface
12 . . . Piezoelectric body
12a, 12b . . . Principal surface
12s-12v . . . Side surface
12w . . . Recessed portion
12x . . . Bottom
12z . . . Crack
13a, 13b . . . Metal layer
14a, 14b . . . External electrode
14m, 14n . . . End part
14p, 14q . . . Periphery
14s, 14t . . . Surface
14u, 14v . . . Outer peripheral surface
16 . . . Coating layer
16m, 16n, 16p, 16q . . . Cured resin
17a, 17b . . . Reinforcing member pattern
18a, 18b . . . Reinforcing member
18m, 18n, 18p, 18q . . . Reinforcing member
18u, 18v . . . Outer peripheral surface
20 . . . Aggregate substrate
22 . . . Groove
24 . . . Cut surface
30 . . . Dicing tape (film)
31 . . . Second film
32 . . . Mask
34 . . . Resin

The invention claimed is:

1. A piezoelectric actuator comprising:
a piezoelectric body having two principal surfaces facing each other and four side surfaces connecting the two principal surfaces, each of the four side surfaces having a flat part and recessed portions;
a first external electrode on a first of the two principal surfaces;
a second external electrode on a second of the two principal surfaces;
a coating layer on each of the four side surfaces,
wherein the coating layer covers the flat parts and extends into the recessed portions in the four side surfaces, and a first portion of the coating layer in the recessed portions is thicker than a second portion of the coating layer covering the flat part; and
a reinforcing member made of resin on a first surface of at least one of the external electrodes, the reinforcing member extending along a periphery of the first surface of the at least one of the external electrodes, the first surface of the at least one of the external electrodes being opposite to a second surface of the at least one of the external electrodes that is in contact with the piezoelectric body.

2. The piezoelectric actuator according to claim 1, wherein the reinforcing member is integral with the coating layer.

3. The piezoelectric actuator according to claim 2, wherein the coating layer is made of a cured resin which has an uncured-state viscosity of greater than 1 mPa·s and less than 100 mPa·s.

4. The piezoelectric actuator according to claim 3, wherein the coating layer has thicknesses of 1 μm or less on the four side surfaces.

5. The piezoelectric actuator according to claim 1, wherein the coating layer is made of a cured resin which has an uncured-state viscosity of greater than 1 mPa·s and less than 100 mPa·s.

6. The piezoelectric actuator according to claim 5, wherein the coating layer has thicknesses of 1 μm or less on the four side surfaces.

7. The piezoelectric actuator according to claim 1, wherein the piezoelectric body is a chip cut from an aggregate substrate, and the four side surfaces are cut surfaces of the aggregate substrate.

8. The piezoelectric actuator according to claim 1, wherein the coating layer is in contact with bottoms of the recessed portions.

9. A magnetic disc apparatus on which the piezoelectric actuator according to claim 1 is mounted.

* * * * *